METHOD OF MAKING COPPER FOIL, AND THE APPARATUS THEREFOR
Filed Feb. 18, 1960
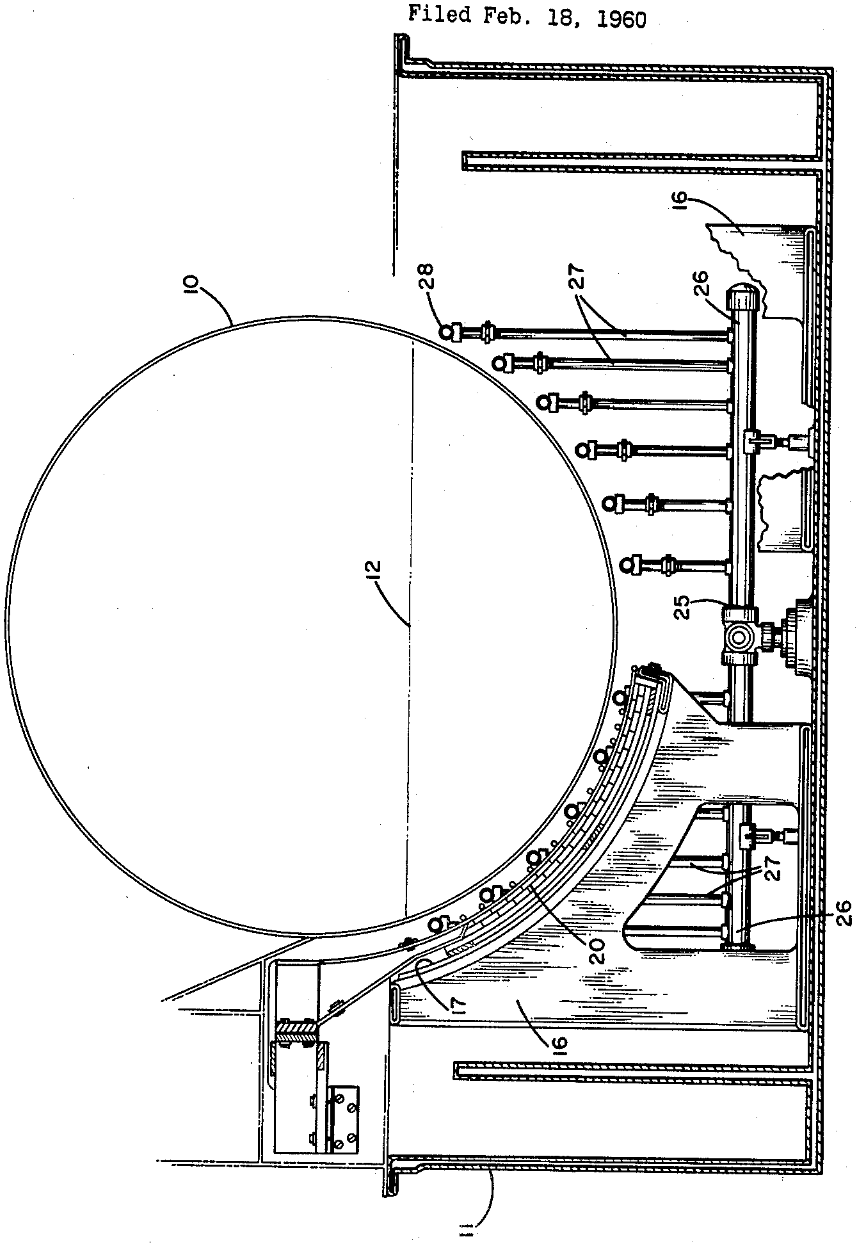
*INVENTOR.*
CHARLES C. CONLEY
HARRY V. POCHAPSKY
LAWRENCE D. RIDENOUR
BY Eber J. Hyde
ATTORNEY United States Patent Office 3,151,048
Patented Sept. 29, 1964

3,151,048

METHOD OF MAKING COPPER FOIL, AND THE APPARATUS THEREFOR

Charles C. Conley, Rocky River, Harry V. Pochapsky, Willowick, and Lawrence D. Ridenour, McConnelsville, Ohio, assignors to Clevite Corporation, Cleveland, Ohio, a corporation of Ohio Filed Feb. 18, 1960, Ser. No. 9,503
12 Claims. (Cl. 204—13)

This invention pertains to the method of making copper foil by electrodeposition and to the plating equipment.

For many years thin copper foil has been satisfactorily produced by a plating process, the resulting foil going into the building trade to be used as a moisture barrier. However, it has been found that the foil is not satisfactory for use in printed circuit techniques.

For printed circuits Government specifications require the copper foil to be at least 99.5% pure, and it is imperative that there be no porosity or copper "lace" effect in the foil. These stringent requirements, plus the fact that the printed circuit foil is thinner than the moisture barrier foil and consequently is harder to plate in a pore-free manner, have required new techniques in the production of pure, "lace free" foil.

It is an object of this invention to provide a process and apparatus therefor for producing pure, "lace free" copper foil especially suited for use in printed circuits.

In the past lead drums have been utilized upon which the copper was plated, and during the plating process the surface of the drum was continuously ground or machined so that a fresh clean surface was utilized for the deposition of the thin copper foil. Many small particles of lead machined from the drum do not fall away from the surface of the drum and the copper foil is plated right over them. Then when the foil is stripped from the drum these small lead particles are torn from the surface of the drum and remain with the foil, thus adding considerable impurities to the foil. This renders the foil unsuitable for high quality printed circuit use.

A further object of the invention is to provide apparatus for and methods of producing copper foil for printed circuit work, wherein the apparatus does not have to be continuously worked or ground in order to produce good foil.

Also, in the past, copper foil has been made by a continuous process involving electrodeposition on a chromium plated drum. See Patent 2,203,253, issued to Morris Brown on June 4, 1940. Brown's preferred construction was particularly suitable for production of copper foil whose thickness ranged below .0003", but the face of the foil away from the drum was rough and spongy so that it had to be polished and rolled in order to produce a product suitable for use in the manufacture of condensers.

With the advent of printed circuits it has become important to produce copper foil whose thickness is on the order of 5, 10 and 15 times as thick as Brown's foil, and the foil absolutely must be free of pores and the purity must be better than 99.5%. To produce a pore free foil on the order of five to ten times as thick as Brown's has presented problems which have now been overcome.

It is an object of the present invention to provide a method and a device for continuously producing copper foil by a plating method utilizing a chromium plated drum wherein dense, thick, pore-free foil is obtained.

Another object of the invention is to provide a method of and the means for continuously producing substantially pure one-ounce copper foil—that is, copper foil of sufficient thickness (about .0014") that one square foot weighs one ounce, and wherein the foil is pore free without polishing or rolling. The method and means also are suitable for the production of two and three ounce foil.

Another object of the invention is to provide apparatus for, and the method of, continuously producing pore-free copper foil of great thickness compared to prior art foil, and wherein the apparatus can be used continuously over a long period of time, and wherein the apparatus can be shut down, and then restarted with a minimum of time spent in reconditioning the apparatus.

Still another object of the invention is to provide plating apparatus for continuously producing dense, pore-free copper foil, wherein the foil as it comes out of the apparatus does not have to be rolled or polished, and wherein the apparatus does not require expensive and time consuming maintenance.

A further object of the invention is the provision of a plating drum especially suited to the production of pure, solid, copper foil, and the provision of a method for preparing the surface of the drum, protecting the drum against deterioration and maintenance or rehabilitation of the surface of the drum in the event the surface deteriorates.

For a better understanding of the present invention, together with other and further objects thereof, reference is had to the following description taken in connection with the accompanying drawings, and its scope will be pointed out in the appended claims.

The figure shows an end view of the plating apparatus with the end of the tank broken away to show, on the left hand side, the apparatus for supporting the supply of copper, and broken away on the right hand side to show the piping through which the electrolyte flows.

Referring to the drawing, the plating apparatus comprises a cathode drum 10 suitably journaled on bearings, not shown, and continuously driven by mechanism not shown. The drum 10 may be about five feet in diameter and 80 inches long in order to produce a large sheet of copper, though obviously these dimensions are not critical or limiting. A large tank 11 holds the electrolyte 12 in contact with substantially the entire bottom half of the cathode drum 10. Suitable washing and reeling mechanism 13, not shown, may be mounted on the tank 11 so that as the foil 15 is stripped from the drum 10 it is washed, dried, and coiled.

Within the tank 11 there are two supporting units 16, one on each side of the drum 10, each of which has an arcuately shaped upper face 17 spaced but a short distance from a sector of the drum 10. Each supporting unit extends axially substantially the full length of the drum, and holds a supply of copper 20, preferably in the form of substantially pure copper bars, closely adjacent to, but spaced from the surface of the drum 10. These copper bars serve as the anode, and suitable electrolyte 12 covers the copper bars. Also mounted within the tank 11 is a piping system 25 comprising a horizontal distributing manifold 26, vertical riser pipes 27, and a plurality of perforated horizontally extending agitator pipes 28 close to the surface of the drum, and each of which has through it a plurality of holes facing the surface of the cathode drum 10.

Electrolyte 12 is circulated by pumps from within the tank 11, through the piping system 25 at the rate of about 400 gal./min. to the agitator pipes 28, and out of the evenly distributed holes therein to establish a smooth yet turbulent, agitation of the electrolyte at the surface of the drum where copper from the anode 20 is being deposited. This agitation by the electrolyte right at the surface of the drum greatly increases the rate of deposition of the copper, and helps to produce a smooth, dense, pore-free layer. Also, it is important in the process that the copper be obtained from the supply 20, rather than from the electrolyte as has been done in the past. Electrolyte sheet copper or copper shot in suitable containers could be used instead of the copper bars. Also, copper shot or clippings may be used, and as the supply is consumed fresh copper may be periodically or continuously fed into the supporting unit.

To produce one-ounce foil the drum should be rotated at about 12" per minute, and to produce two-ounce foil the drum should be rotated at about 6" per minute.

The plating bath is held at a temperature of about 104° F. and the current density is 135–145 amps. per sq. ft. The electrolyte flows at a rate of 400 gallons per minute, and at least 20% is filtered before return to maintain a clean bath; however, it is preferable to filter as much as possible in order to avoid rough deposition of the copper.

The plating solution preferably is comprised of copper 50 g./l. or copper sulphate 200 g./l., and sulphuric acid 100 g./l., with hide glue and goulac each in the amount of one part per million and chloride in the amount of .035 g./l. These proportions are not highly critical and can be varied somewhat, except that the glue and goulac content should not go too low, as is more fully described herein.

Perhaps the most important single factor involved in successfully plating pure, thick, solid copper foil is the cathode drum, and especially the surface of the drum on which the copper is deposited and from which it is thereafter stripped.

Preparation and periodic maintenance of the chrome surface of the drum is of extreme importance. Unless the proper type of chrome plating is used, and unless the proper chrome plating is dressed just right the drum will not produce pure, solid, pore-free copper foil. Furthermore, even after the chrome plating on the drum is properly applied and dressed, the drum must be maintained from time to time or it will cease to produce solid copper foil and will begin to produce porous foil.

Preferably the drum is made of stainless steel, though regular steel is usable; so also would be copper or aluminum. The drum must be flaw-free and polished to a surface smoothness on the order of 8–12 micro-inches. A base layer of nickel plate may be applied, though this is not critical. This regular chrome is ground smooth and all flaws are eliminated and replated. Thereafter the flaw-free surface is ground to a smooth, uniform, flaw-free surface.

On the flaw-free surface of the drum there is then deposited a layer about .002" thick of special crack-free chromium. This crack-free chromium is also known as strain-free chromium and is softer than the regular hard chromium. Reference may be made to U.S. Patent 2,686,756, issued to J. E. Stareck and Ronald Dow. This patent teaches how to apply crack-free chromium.

It is essential to the successful plating of pure, thick-pore-free copper that crack-free chromium be applied to the plating surface of the drum. After the layer of crack-free chromium has been applied to the surface of the drum all surface flaws must be repaired by suitable techniques. Any imperfection at this point will forever be repeatedly reproduced in the copper foil as the plating drum rotates.

The surface of the as-plated crack-free chromium is oxidized to a certain extent, and due to the plating process which produced the soft chrome layer has other complex chromium compounds adhering to it. The oxide and the complex compounds must be removed, and they must be removed by a method which produces a minimum of heating, otherwise the removal process will itself oxidize the surface. A surface of crack-free chromium which is perfect except that it is contaminated by oxides or complex chromium compounds will not produce pore-free copper. It is essential to this invention that the surface of the crack-free chromium be dressed mechanically in such a manner that the primary action is one of cutting, rather than one of burnishing, with a minimum of heat generation and with a minimum of oxidation and contamination. This dressing action can satisfactorily be achieved by use of a flexible rotary wheel such as Minnesota Mining and Manufacturing Company's "P.G." wheel having #180 alumina grit bonded to it by means of glue. Wheel speed and pressure must be such that the oxides and complex compounds are cut from the surface of the crack-free chromium, rather than burnished, and the dressing operation should produce a surface having roughness on the order of 8–12 micro-inches.

After the surface of the drum has been dressed, it must quickly be placed in service or sufficient oxidation and/or contamination will take place that the drum will not produce pore-free copper. Once the drum is put in continuous plating operation, and with certain precautions in respect to the plating bath and to shut-down time which are hereafter explained, the drum will operate for months and produce pure pore-free copper foil.

Systems may be devised to protect the surface of the newly dressed drum from oxidation and/or contamination by coating the drum surface until just prior to starting the continuous plating operation. One such method is to immediately plate the surface of the drum with a layer of pore-free copper, and to keep the copper in intimate contact with the drum until just prior to starting the continuous plating operation, at which time the protective plate is stripped off. This same technique must be used if the continuous process is stopped for more than a few hours. Otherwise contact with the air will cause deterioration of the drum surface and will cause the drum to produce porous copper foil.

In order to reduce to a minimum the length of time the specially prepared crack-free chromium is exposed to air during the plating process the copper foil is retained on the drum for about 350° of the drum's surface, prior to stripping it off. Consequently, only about 10° of the drum's surface is exposed to air at a given time. In order to keep the surface of the drum in good condition and to retard its deterioration, the glue and goulac in the copper solution must each be maintained at about one part per million, otherwise the surface seems to slowly deteriorate even though its contact with atmosphere is carefully kept to a minimum. With the optimum amount of glue and goulac the structure of the copper crystals is columnar, but when the concentration drops too low the crystal structure changes from columnar to a random equi-axed structure. Phenolsulphuric acid up to about 1 p.p.m. and citric acid 1–5 p.p.m. may take the place of the glue and goulac since they too cause the copper crystals to deposit in a columnar structure.

A fresh and properly abraded surface on chromium, that is smooth, sound and crack-free to begin with, will accept a continuous, pore-free electrodeposit of copper under the conditions of our foil making process. That is to say, columnar copper crystals will nucleate immediately over 100% of the surface of the chromium. When such a copper deposit is sufficiently thick that it may be mechanically removed, by pulling, from the chromium, then a new and equally sound deposit of copper may be made immediately on the same chromium surface. This alternate deposition and stripping of copper foil from a sound, properly abraded chromium surface may be repeated many times. Upon prolonged exposure to air and moisture (atmospheric exposure) the chromium surface will absorb an adherent film of gas or oxides which is electrically insulating in character. The thickness of this film and therefore its insulating qualities, increases with time of exposure. With this film present upon the chromium surface, nucleation of copper crystals will take place only at the thinnest points of the film, that is, at the points of least electrical resistance. As this film increases in thickness, the points of nucleation decrease in number until only small discrete islands of copper are deposited, instead of a continuous sheet of foil. With thinner films, it is possible to nucleate a sufficient number of separate crystals per unit areas so that lateral crystal growth will cause them to join and be stripped from the chromium as foil. However, this foil will be porous, and the porosity will vary from a condition of only a few small holes per square inch of surface area to the condition of "copper-lace" in which it is possible to "see" through the foil.

It has been found, both in the laboratory, and in production foil operations, that the chromium surfaces on the foil producing drums can be shielded and protected from this type of degradation during idle periods by coating them with at least 1 mil of sound copper. This copper shield is easily removable when production of foil is resumed. If the chromium should be exposed to air more than two to three hours, depending on the conditions of temperature and humidity, the thickness of the absorbed film may be great enough to cause porosity in the foil produced on this surface. In such a case, the chromium surface must be rendered film-free by proper abrasion techniques, as heretofore described.

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

We claim:

1. The method of producing copper foil which comprises the steps of: providing a drum, plating on the surface of said drum a layer of crack-free chromium, thereafter dressing the surface of said crack-free chromium to remove primarily by a cutting action with a minimum of heat generation chromium oxides and other complex chromium compounds adhering to the surface as a result of the plating operation and subsequent exposure to atmosphere, and thereafter putting the dressed drum into copperplating service prior to exposure to air for a length of time sufficient to establish a given amount of oxides on the chromium plated surface of said drum to cause said drum to plate porous foil.

2. The method as set forth in claim 1, further characterized by completely covering the plating surface of the drum with a protective coating of plated copper prior to temporarily shutting down the plating operation, and by removing said protective coating prior to starting up the plating operation.

3. The method as set forth in claim 1, further characterized by a continuous method wherein the plated copper is stripped from the drum, the further steps of maintaining approximately 40% of the area of the plating surface of the drum below the level of the plating solution, and stripping the copper from the drum at a location such that at all times during the continuous plating process about 97% of the plating surface of the drum is covered by plated copper.

4. The method as set forth in claim 3, further characterized by completely covering the plating surface of the drum with a protective coating of plated copper prior to temporarily shutting down the plating operation, and by removing said protective coating prior to starting up the plating operation.

5. The method as set forth in claim 3, further characterized by maintaining in said plating bath about one p.p.m. of glue and one p.p.m. of goulac in order to retard oxidation of the plating surface of said drum during the plating operation.

6. The method as set forth in claim 4, further characterized by inspecting the copper foil as it is stripped from said drum and upon discovering an area of porous foil redressing the drum.

7. The method of producing substantially pure, solid copper foil which comprises the steps of: providing a drum, plating on the surface of the drum a layer of crack-free chromium, thereafter dressing the surface of said crack-free chromium to remove primarily by a cutting action with a minimum of heat generation chromium oxides and other complex chromium compounds adhering to the surface as a result of the plating operation and subsequent exposure to atmosphere, thereafter putting the dressed drum into copper plating service with the surface of the crack-free chromium substantially unoxidized, plating on the surface of said substantially unoxidized crack-free chromium a layer of copper whose appearance is columnar, and stripping said layer of copper from said drum.

8. The method as set forth in claim 7, further characterized by keeping about 350° of said drum covered by plated copper during the plating and stripping processes.

9. The method as set forth in claim 7, further characterized by plating solution in contact with the surface of said drum and containing about 1 p.p.m. of glue and 1 p.p.m. of goulac.

10. The method of continuously producing substantially pure, solid copper foil which comprises the steps of: providing a drum, plating on the surfacce of the drum a layer of crack-free chromium, thereafter dressing the surface of said crack-free chromium to remove primarily by a cutting action with a minimum of heat generation chromium oxides and other complex chromium compounds adhering to the surface as a result of the plating operation and subsequent exposure to atmosphere, thereafter putting the dressed drum into copper plating service with the surface of the crack-free chromium substantially uunoxidized, plating on the surface of said substantially unoxidized crack-free chromium a layer of copper foil, stripping said layer of copper foil from said drum, inspecting the copper foil as it comes off of said drum for evidence of porosity in the copper foil, and upon detecting porosity redressing the surface of said drum.

11. The method of continuously producing substantially pure, solid copper foil which comprises the steps of: providing a drum, plating on the surface of the drum a layer of crack-free chromium, thereafter dressing the surface of said crack-free chromium to remove primarily by a cutting action with a minimum of heat generation chromium oxides and other complex chromium compounds adhering to the surface as a result of the plating operation and subsequent exposure to atmosphere, thereafter putting the dressed drum into copper plating service with the surfacce of the crack-free chromium substantially uunoxidized, plating on the surface of said substantially unoxidized ccrack-free chromium a layer of copper foil, stripping said layer of copper foil from said drum, and upon terminating the continuous aspect of said plating operation coating said drum with about .001" of pore-free copper and maintaining said coating on said drum until just prior to restarting the continuous production of foil.

12. A device for continuously producing substantially pure, solid copper foil from an electrolytic bath comprising, in combination; a tank for containing said electrolytic bath, a cathode drum mounted for rotation in said electrolytic bath, said drum having a surface coating of substantially uunoxidized crack-free chromium, support means in said bath, an anode supply of copper held by said support means closely adjacent to the surface of said cathode drum at a location below the level of said electrolytic bath, perforated pipe means adjacent the portion of said drum below the level of the bath with said perforations pointing toward said drum, and means for pumping said electrolytic bath material through said pipes to agitate the bath at the location where the copper is deposited on said drum.

References Cited in the file of this patent

UNITED STATES PATENTS

| | | |
|---|---|---|
| 1,760,028 | Williams et al. | May 27, 1930 |
| 1,978,037 | Yates | Oct. 23, 1934 |
| 2,203,253 | Brown | June 4, 1940 |
| 2,429,902 | Sternfels | Oct. 28, 1947 |
| 2,477,808 | Jones | Aug. 2, 1949 |
| 2,556,635 | Skowronski | June 12, 1951 |
| 2,686,756 | Stareck et al. | Aug. 17, 1954 |
| 2,865,830 | Zoldas | Dec. 23, 1958 |

FOREIGN PATENTS

| | | |
|---|---|---|
| 551,103 | Great Britain | Feb. 8, 1943 |